(12) United States Patent
Kato et al.

(10) Patent No.: US 11,320,952 B2
(45) Date of Patent: May 3, 2022

(54) TOUCH PANEL

(71) Applicant: Futaba Corporation, Mobara (JP)

(72) Inventors: Takao Kato, Mobara (JP); Shigeharu Shirahama, Mobara (JP)

(73) Assignee: Futaba Corporation, Mobara (JP)

( * ) Notice: Subject to any disclaimer, the term of this patent is extended or adjusted under 35 U.S.C. 154(b) by 0 days.

(21) Appl. No.: 17/101,875

(22) Filed: Nov. 23, 2020

(65) Prior Publication Data
US 2021/0157452 A1 May 27, 2021

(30) Foreign Application Priority Data

Nov. 27, 2019 (JP) .............................. JP2019-214594

(51) Int. Cl.
G06F 3/044 (2006.01)
(52) U.S. Cl.
CPC .. G06F 3/0446 (2019.05); *G06F 2203/04111* (2013.01)
(58) Field of Classification Search
CPC ......... G06F 3/0446; G06F 2203/04111; G06F 3/04164; H05K 1/0259
See application file for complete search history.

(56) References Cited

U.S. PATENT DOCUMENTS 10,152,147 B2 * 12/2018 Choi ..................... G06F 3/041
10,180,748 B2 * 1/2019 Kim ..................... H03K 17/962
10,496,231 B2 12/2019 Naito et al.

2009/0283300 A1 * 11/2009 Grunthaner ............ H05K 1/118
174/254
2011/0084267 A1 * 4/2011 Yamazaki ........... H01L 29/4908
257/43
2011/0084268 A1 * 4/2011 Yamazaki ........... H01L 29/7869
257/43
2011/0193793 A1 * 8/2011 An ........................ G06F 3/0445
345/173

(Continued)

FOREIGN PATENT DOCUMENTS

JP 2014089641 A 5/2014
JP 2015018317 A 1/2015

(Continued)

OTHER PUBLICATIONS

Japan Patent Office Notice of Reasons for Refusal for application 2019-214594 dated Dec. 27, 2021. With translation. 6 pages.

*Primary Examiner* — Amy Onyekaba
(74) *Attorney, Agent, or Firm* — Quarles & Brady LLP

(57) ABSTRACT

A touch panel includes a substrate having an operation face, a sensor part provided at a sensor face of the substrate, and a wire led out from the sensor part to the sensor face to be connected to an external connection part. The sensor part and the wire are covered by an insulation layer. A cutout is provided to the insulation layer to expose a part of the wire to which the external connection part is connected. An insulation part is provided to cover the external connection part, the insulation layer and the wire located at the cutout. The touch panel can reliably prevent static electricity generated at the operation face during panel operation from entering the sensor part via the wire and the external connection part and causing electrostatic destruction of a bridge and such of the sensor part.

1 Claim, 3 Drawing Sheets

(56) References Cited

U.S. PATENT DOCUMENTS

| | | | | |
|---|---|---|---|---|
| 2012/0127094 A1* | 5/2012 | Jeong | .................... | G06F 3/0446 |
| | | | | 345/173 |
| 2013/0106747 A1* | 5/2013 | Choi | .................... | G06F 3/0443 |
| | | | | 345/173 |
| 2014/0071064 A1* | 3/2014 | Cho | ...................... | G06F 3/0443 |
| | | | | 345/173 |
| 2014/0240616 A1* | 8/2014 | Huang | ................... | G06F 3/0448 |
| | | | | 349/12 |
| 2014/0340597 A1* | 11/2014 | Sato | ..................... | G06F 3/0445 |
| | | | | 349/12 |
| 2016/0098143 A1* | 4/2016 | Kida | ....................... | G06F 3/047 |
| | | | | 345/174 |
| 2017/0090652 A1* | 3/2017 | Sato | ........................ | G06F 3/044 |
| 2017/0123570 A1* | 5/2017 | Maruyama | .......... | G06F 3/04164 |
| 2017/0229521 A1* | 8/2017 | Hirota | ................. | H01L 27/3288 |
| 2017/0329434 A1* | 11/2017 | Naito | ................... | H05K 9/0079 |
| 2018/0323240 A1* | 11/2018 | Won | .................... | H01L 27/3276 |
| 2019/0220123 A1* | 7/2019 | Kanaya | ................ | G06F 3/0443 |
| 2019/0265812 A1* | 8/2019 | Shimoyama | .......... | G03F 7/0035 |
| 2021/0048923 A1* | 2/2021 | Niwa | .................... | G06F 1/1626 |
| 2021/0271345 A1* | 9/2021 | Lu | ........................ | G06F 3/0445 |

FOREIGN PATENT DOCUMENTS

| | | |
|---|---|---|
| JP | 2017-207816 A | 11/2017 |
| WO | 2013141292 A1 | 9/2013 |

\* cited by examiner

TOUCH PANEL

CROSS-REFERENCE TO RELATED APPLICATION

This application claims the priority benefit of Japanese Patent Application No. 2019-214594 filed Nov. 27, 2019, which is fully incorporated herein by reference.

TECHNICAL FIELD

The present invention relates to a touch panel having a sensor part formed at a sensor face of a substrate located on an opposite side of an operation face of the substrate, in which an external connection part is connected to wires that are led out from the sensor part to the sensor face. In particular, the present invention relates to a touch panel that prevents static electricity from flowing from the operation face to the sensor face and causing electrostatic destruction of the sensor part.

BACKGROUND

Patent Document 1 mentioned below discloses a touch panel. As described in paragraphs [0023] to [0028] of the specification of Patent Document 1, this touch panel includes a sensor part 2 formed at a back face of a substrate 11 on an opposite side of an operation face, and a housing 3 formed on an outer periphery of the substrate 11 by insert injection molding. The sensor part 2 includes first electrodes 13 extending in an X direction and second electrodes 14 extending in a Y direction on the back face of the substrate 11. An insulation layer 16 is formed at an intersection of the first electrode 13 and the second electrode 14, and a bridge wire 17 is formed in the Y direction over the first electrode 13 and the insulation layer 16 to connect the second electrode 14 and the second electrode 14.

In addition, this touch panel further includes a noise guide member 20 made of metal and configured to guide noise current such as static electricity that is generated during an operation. The noise guide member 20 includes a front face end 20a positioned so as not to protrude from a front face 3a of the housing 3, and a back face end penetrating from the front face 3a to a back face 3b of the housing 3 while being connected to a ground. The noise guide member 20 guides noise current, e.g., static electricity generated during an operation and such, toward the ground, and thereby reduces malfunction of the electrodes in the touch panel due to the noise current.

PRIOR ART DOCUMENT

Patent Document

Patent Document 1: JP 2017-207816 A

SUMMARY OF THE INVENTION

In the touch panel disclosed in Patent Document 1, the bridge wire of the touch panel has lower resistance compared to the first electrode and the second electrode, thus there may be a possibility that electrostatic destruction occurs depending on condition for use and/or environment condition. Thus, in a touch panel in which a sensor part, that includes a plurality of electrodes intersecting each other via bridge wires in an insulated manner, is formed at a back face of a substrate located on an opposite side of an operation face of the substrate, there may be a possibility that static electricity flows from the operation face to the back face where the sensor part is formed and causes electrostatic destruction of the bridge wire, if condition for use and/or environment condition is inappropriate.

In view of the above-described problem in the conventional art, an object of the present invention is to provide a touch panel that has a sensor part formed at a sensor face of a substrate located on an opposite side of an operation face of the substrate and that prevents static electricity from flowing from the operation face to the sensor face and causing electrostatic destruction of the sensor part.

In order to achieve the above-described object, the present invention provides, in a first aspect, a touch panel including a substrate having an operation face on which an operator's finger touches and a sensor face located on an opposite side of the operation face; a sensor part provided at the sensor face; a wire led out from the sensor part to the sensor face to be connected to an external connection part; and an insulation layer that covers the sensor part and the wire.

In a second aspect, the touch panel further includes a cutout provided to the insulation layer to expose a part of the wire, and an insulation part that covers the wire exposed at the cutout.

According to the touch panel of the first aspect, since the sensor part and the wire are covered by the insulation part, even if static electricity is generated on the operation face of the substrate during panel operation and such and has flowed to the sensor part on the opposite side of the operation face, the touch panel can reliably prevent this static electricity from entering the sensor part and causing electrostatic destruction of electrodes and such of the sensor part.

According to the touch panel of to the second aspect, the wire led out from the sensor part to the sensor face is exposed at the cutout of the insulation layer to be connected to the external connection part, but this wire which is exposed at the cutout where the insulation layer and the external connection part is facing to each other is covered by the insulation part. Consequently, even if static electricity has flowed from the operation face to the sensor part, the touch panel can reliably prevent this static electricity from entering the sensor part through the wire and/or the external connection part at the cutout of the insulation layer and causing electrostatic destruction of electrodes and such of the sensor part.

DETAILED DESCRIPTION OF THE EXEMPLARY EMBODIMENTS

Figure 1:
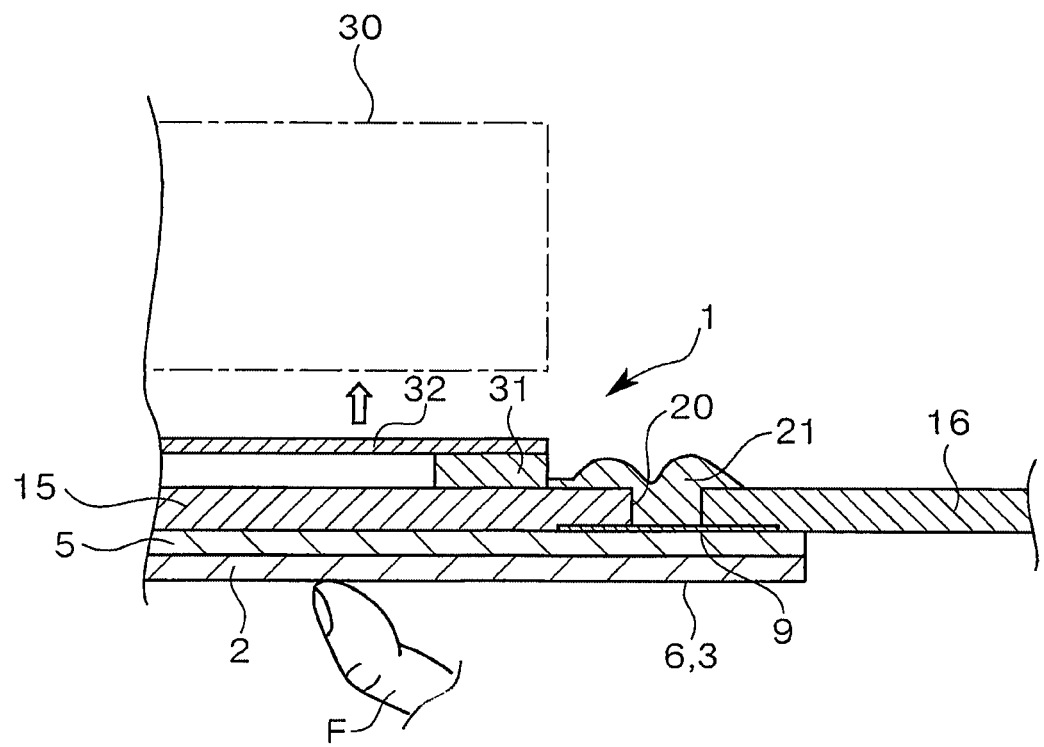
FIG. 1 is a cross-sectional view of a touch panel according to an embodiment of the present invention.

In the following, a touch panel 1 according to an embodiment of the present invention is explained with reference to FIG. 1 to FIG. 5. As shown in FIG. 1, the touch panel 1 according to this embodiment is a projected electrostatic capacitance type device which uses two lateral and traversal intersecting rows of electrodes not shown in FIG. 1 (shown in FIG. 2 as X electrodes and Y electrodes 8) to detect, as positional coordinates on an operation face 3, that electrostatic capacitance has changed at a certain position on the operation face 3 due to touching or approaching of a finger F of an operator with respect to the operation face 3 of a substrate 2.

Figure 2:
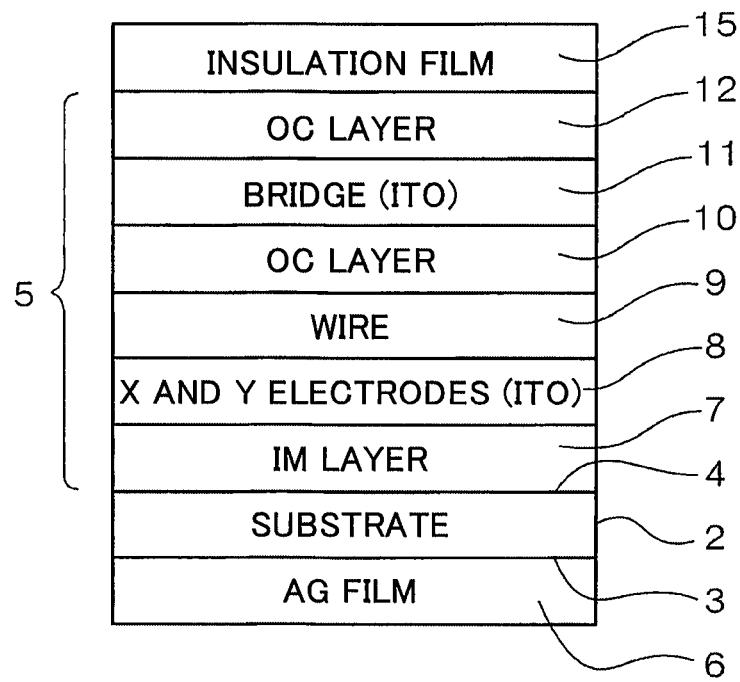
FIG. 2 illustrates a detailed configuration of the touch panel according to the embodiment of the present invention.

As shown in FIG. 2, the touch panel 1 includes the substrate 2 made of glass as a base body at which a sensor part 5 is formed. One face (a lower face in FIG. 2) of the substrate 2 is the operation face 3 on which a finger F of an operator (shown in FIG. 1) touches. In this example, an AG (anti-glare) film 6 that improves visibility by diminishing reflections is attached to the operation face 3. In FIG. 1, although it is actually the AG film 6 that the finger F of the operator is touching, the same draw-out line from the same position is used for indicating the AG film 6 and the operation face 3 of the substrate 2, just for convenience of illustration.

As shown in FIG. 2, another face (an upper face in FIG. 2) of the substrate 2, which is herein referred to as a sensor face 4, is provided with a sensor part 5 constituted of a plurality of layers having various functions. As described below with reference to FIG. 2, the sensor part 5 is constituted of six layers from an IM layer 7 to an OC (overcoat) layer 12.

It is noted that the configuration of the sensor part 5 shown in FIG. 2 is represented schematically in a laminating sequence, and actual thickness of each layer is not necessarily relevant to the thickness shown. A detailed configuration of the sensor part 5 will be described below. It should also be noted that configurations of the substrate 2, the sensor part 5 and other elements described later shown in FIG. 1 are represented schematically, and actual dimensions thereof are not necessarily relevant to dimensions shown.

As shown in FIG. 2, the sensor face 4 of the substrate 2 is provided with an IM (Index Matching) layer 7 that reduces the optical reflectivity of later-described X electrodes and Y electrodes (which are collectively indicated with a reference sign 8) to make them less visible. The X electrodes and the Y electrodes 8 made of ITO (Indium Tin Oxide) are formed on the IM layer 7. On the sensor face 4 of the substrate 2, the X electrodes and Y electrodes extend in the X direction and the Y direction, respectively, so as to intersect each other and in a pattern insulated from each other. The X electrodes and the Y electrodes are respectively connected to a plurality of wires 9 provided thereon. The wires 9 constitute a part of the sensor part 5, but are led out onto the sensor face 4 of the substrate 2 for connection with an external device, as described hereinafter with reference to FIG. 1 and FIG. 3. An OC (overcoat) layer 10 for providing insulation is arranged on the wires 9. On the OC layer 10, a bridge 11 constituted of ITO is provided to electrically connect electrodes that are separated by another electrode at an intersection of the X electrode and the Y electrode. On the bridge 11, the insulative OC (overcoat) layer 12 is provided for protecting the X electrodes, the Y electrodes and the bridges 11 and for providing a smooth surface.

As shown in FIG. 1 and FIG. 2, the sensor part 5 is covered with an insulation film 15 as an insulation layer. A TAC (Triacetylcellulose) film, which is an AR (Anti-Reflection) film that reduces reflectivity, may be used as the insulation film 15. Alternatively, instead of using the insulation film 15 of this embodiment, the insulation layer may be formed by applying an insulation material in the form of liquid over the sensor part 5 so as to be in the required thickness and curing it.

Figure 3:
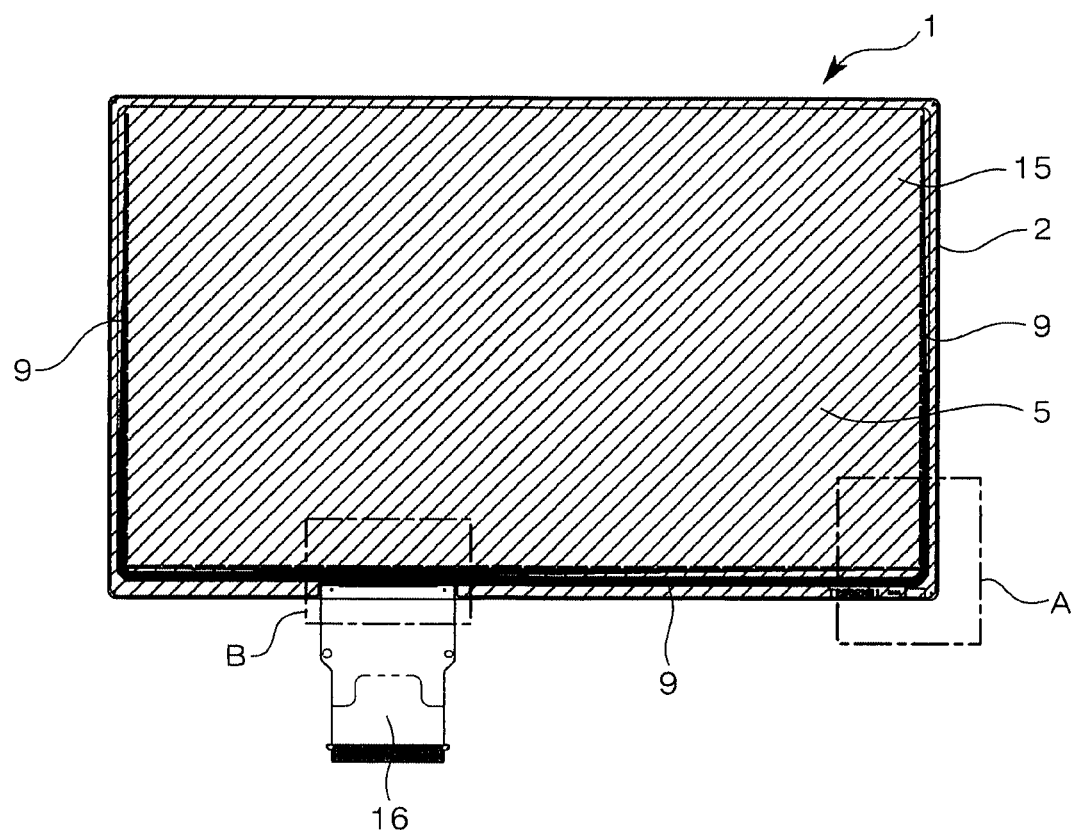
FIG. 3 is a back view showing a sensor part side of the touch panel according to the embodiment of the present invention.

FIG. 3 is a back view of the sensor part 5 side of the touch panel 1. In FIG. 3, the wires 9 led out from the X and Y electrodes 8 of the sensor part 5 (refer to FIG. 2) onto the sensor face 4 of the substrate 2 are arranged in a substantially C-like pattern along a pair of short sides and one long side of the substrate 2. As shown in FIG. 3, the wires 9 disposed along the pair of short sides of the substrate 2 are shown thinner in the upper side and gradually become thicker as approaching to the lower side, and the wires 9 at the lower side that are positioned parallel to the one long side of the substrate 2 are thickest. This variation in the thickness of the wires 9 is due to the fact that the wires 9 are respectively led out from the plurality of electrically divided X and Y electrodes 8, and thus the number of wires 9 led out onto the substrate 2 increases as approaching to the lower side along the pair of short sides of the substrate 2. It is noted that in the back view shown in FIG. 3 and the cross-sectional view shown in FIG. 1, the wires 9 are illustrated as a single line for convenience of illustration; however, it is actually a group of several wires 9 insulated from each other.

Figure 4:
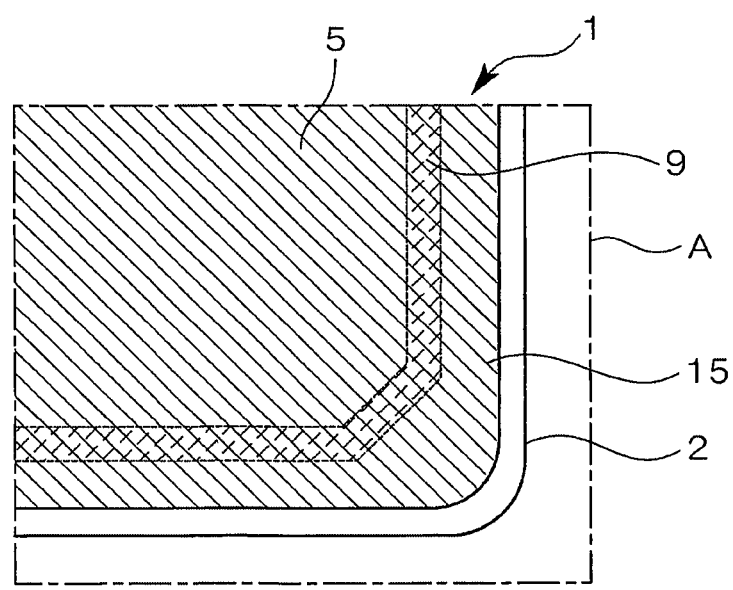
FIG. 4 is an enlarged view of a portion A shown in FIG. 3 surrounded by a dotted line.

In FIG. 3, the insulation film 15 is represented as a hatched region. The insulation film 15 is provided to a substantially entire face of the substrate 2 on the sensor face 4 side so as to cover the sensor part 5 provided to the sensor face 4 side of the substrate 2 and the wires 9 led out from the sensor part 5 to the sensor face 4. In a precise sense, a dimensional profile (i.e., an outer shape) of the insulation film 15 are slightly smaller than a dimensional profile (i.e., an outer shape) of the substrate 2, and as shown in FIG. 4 which is an enlarged view of a portion A shown in FIG. 3, an outer periphery of the insulation film 15 is positioned inward for about 0.5 mm from an outer periphery of the substrate 2. In addition, the wires 9 are positioned inward for about 1 to 2 mm from the outer periphery of the substrate 2. That is, the wires 9 are covered by the insulation film 15 with a sufficient margin expect for a portion for connection with a later-described external device, thus the sensor part 5 and the wires 9 are kept in an insulated state in a reliable manner so that no static current can flow thereto from outside.

In use, the touch panel 1 of this embodiment is connected to a FPC (Flexible Print Circuit) 16 as an external connection part connected to an external control device, as shown in FIG. 3. Thus, as shown in FIG. 5 which is an enlarged view of a portion B shown in FIG. 3 and FIG. 1 which is a cross-sectional view taken along a line X-X shown in FIG. 5, a cutout 20 is formed at a part of an edge of the insulation film 15 such that a part of the wires 9 is exposed and the FPC 16 is connected to the wires 9 at this position.

Figure 5:
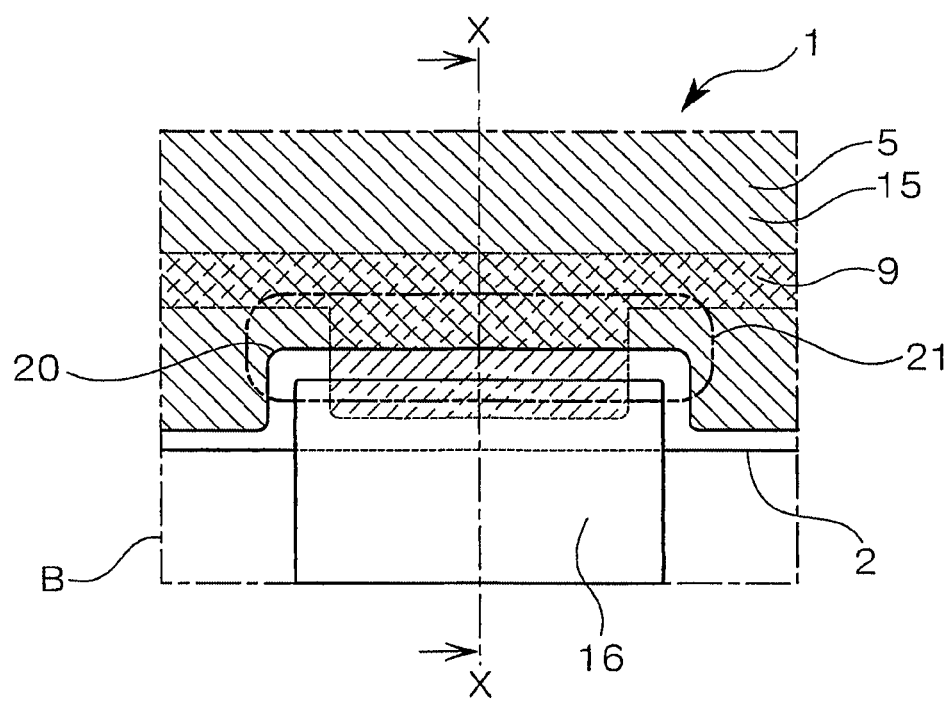
FIG. 5 is an enlarged view of a portion B shown in FIG. 3 surrounded by a dotted line.

As shown in FIG. 1 and FIG. 5, the angled cutout 20 is formed at the edge of the insulation fil 15 at a central portion of the long side of the substrate 2 where the wires 9 are provided. A part of the wires 9 is exposed at the cutout 20, and the FPC 16 is connected to this exposed part of the wires 9. Although the connecting structure of the wires 9 and the FPC 16 is not shown, they can be electrically connected to each other in a reliable manner using a known technique. A gap between the insulation film 15 and the FPC 16 may be for example about 1 mm.

As shown in FIG. 5 with a dashed line and in FIG. 1 which is the cross-sectional view thereof, an insulation part 21 made of resin material if provided between the cutout 20 of the insulation film 15 and the FPC 16 connected to the wires 9. For example, UV-curing resin may be used as resin that constitutes the insulation part 21. The insulation part 21 is provided over an upper face of the insulation film 15 and an upper face of the FPC 16, and fills a gap between the insulation film 15 and the FPC 16 and covers the wires 9. Thus, of the wires 9 that are led out to the sensor face 4 of the substrate 2 and exposed by the cutout 20, a part that is not covered by the FPC 16 is entirely covered by the insulation part 21. Consequently, the wires 9 and the FPC 16 are kept in an insulated state in a reliable manner so that no static current can flow thereto from outside.

As a display element for superposing a desired window on an operation face 3 of the touch panel 1 described above, a liquid crystal panel 30 (refer to FIG. 1), for example, may be used. As shown in FIG. 1, in a case where the touch panel 1 of this embodiment goes to a user as a single item product, a frame-shaped double-sided adhesive tape 31 having substantially the same outer shape as the substrate 2 is attached to an outer periphery of a surface of the insulation film 15 located on the back face side of the touch panel 1, and further, a separator 32 (e.g., a release liner) having substantially the same shape as the substrate 2 is attached to the double-sided adhesive tape 31. A user can attach this touch panel 1 to the liquid crystal panel 30 by removing the separator 32 and attaching the touch panel 1 to a display surface of the liquid crystal panel 30 via the double-sided adhesive tape 31.

As has been explained above, according to the touch panel 1 of this embodiment, the sensor part 5 and the lead-out wires 9 are covered by the insulation film 15, and further, the wires 9 that are led out to the sensor face 4 and exposed at the cutout 20 of the insulation film 15, together with the FPC 16, are covered by the insulation part 21. Consequently, even if static electricity is generated on the operation face 3 of the substrate 2 during operation of the panel and such and has flowed to the sensor part 5, the touch panel 1 of this embodiment can reliably prevent this static electricity from entering the sensor part 5 via the wires 9 and the FPC 16 and such and causing electrostatic destruction of the bridges 11 and/or the electrodes of the sensor part 5.

LIST OF REFERENCE SIGNS 1 touch panel
2 substrate
3 operation face
4 sensor face
5 sensor part
9 wire
15 insulation film as insulation layer
16 FPC as external connection part
20 cutout
21 insulation part
30 liquid crystal panel as display element
F operator's finger

What is claimed is:
1. A touch panel comprising:
a substrate having an operation face on which an operator's finger touches and a sensor face located on an opposite side of the operation face;
a sensor part provided at the sensor face;
a wire led out from the sensor part to the sensor face to be connected to an external connection part;
an insulation layer that covers the sensor part and the wire;
a cutout provided to the insulation layer to expose a part of the wire, and
an insulation part that covers the wire exposed at the cutout,
wherein the insulation part directly covers the wire exposed at the cutout.

* * * * *